US012132512B2

(12) United States Patent
Huang et al.

(10) Patent No.: US 12,132,512 B2
(45) Date of Patent: Oct. 29, 2024

(54) SELF MIXING FREQUENCY DOUBLER TRIPLER CIRCUITS FOR WIRELESS COMMUNICATION

(71) Applicant: Swiftlink Technologies Inc., Richmond (CA)

(72) Inventors: Min-Yu Huang, Richmond (CA); Ayman Eltaliawy, Richmond (CA)

(73) Assignee: SWIFTLINK TECHNOLOGIES INC., Richmond (CA)

(*) Notice: Subject to any disclaimer, the term of this patent is extended or adjusted under 35 U.S.C. 154(b) by 120 days.

(21) Appl. No.: 17/683,879

(22) Filed: Mar. 1, 2022

(65) Prior Publication Data
US 2023/0283317 A1    Sep. 7, 2023

(51) Int. Cl.
*H03B 19/18* (2006.01)
*H01F 38/04* (2006.01)
*H03B 19/14* (2006.01)
*H04B 1/408* (2015.01)

(52) U.S. Cl.
CPC ............. *H04B 1/408* (2013.01); *H01F 38/04* (2013.01); *H03B 19/14* (2013.01); *H03B 19/18* (2013.01)

(58) Field of Classification Search
CPC ...... H03D 7/1466; H03B 19/18; H03B 19/14; H04B 1/408; H01F 38/04
See application file for complete search history.

(56) References Cited

U.S. PATENT DOCUMENTS

| 2016/0099720 A1* | 4/2016 | Bashir | ................. H03B 5/1218 331/8 |
| 2022/0200532 A1* | 6/2022 | Agrawal | ............. H03D 7/1458 |
| 2023/0067052 A1* | 3/2023 | Vogt | ....................... H03B 19/14 |

FOREIGN PATENT DOCUMENTS

CN        112671344 A        4/2021

OTHER PUBLICATIONS

Huang et al. ("A 3.7 mW 75-87-GHz Injection-locked Frequency Tripler Using Bandwidth-enhanced Transformer-coupled Topology for Automatic Radar Applications," Proceedings of the 45th European Microwave Conference, Sep. 10, 2015) (Year: 2015).*

(Continued)

*Primary Examiner* — Patrick C Chen
(74) *Attorney, Agent, or Firm* — WOMBLE BOND DICKINSON (US) LLP (57) ABSTRACT

A frequency tripler circuit includes an amplifier to receive a balanced input signal at an input frequency and outputs a balanced signal at a second harmonic of the input frequency. The frequency tripler circuit includes a passive double balanced mixer coupled to an output of the amplifier to receive the balanced signal at the second harmonic and the balanced input signal to generate an output balanced signal having a frequency triple the input frequency.

20 Claims, 11 Drawing Sheets

(56) References Cited

OTHER PUBLICATIONS

Chen et al., "A K-Band Frequency Tripler Using Transformer-Based Self-Mixing Topology With Peaking Inductor," in IEEE Transactions on Microwave Theory and Techniques, vol. 68, No. 5, pp. 1688-1696, May 2020.

Huang et al., unpublished U.S. Appl. No. 17/102,042 titled, "Bidirectional Image-Rejection Active Array With Reduced LO Requirement," filed Nov. 23, 2020.

Hsiang-Ting Huang, et al., "A 3.7 mW 75-87-GHz Injection-locked Frequency Tripler Using Bandwidth-enhanced Transformer-coupled Topology for Automatic Radar Applications," Proceedings of the 45th European Microwave Conference, Sep. 10, 2015, (4 Pages).

Haikun Jia, et al., "A W-Band Injection-Locked Frequency Doubler Based on Top-Injected Coupled Resonator," IEEE Transactions on Microwave Theory and Techniques, Jan. 2016, vol. 64, No. 1, pp. 210-218.

\* cited by examiner

SELF MIXING FREQUENCY DOUBLER TRIPLER CIRCUITS FOR WIRELESS COMMUNICATION

FIELD OF THE INVENTION

Embodiments of the present invention relate generally to wireless communication devices. More particularly, embodiments of the invention relate to self-mixing frequency doubler tripler circuits for wireless communication.

BACKGROUND

With the persistent market demand for higher data rates, target precision, compact systems, and so on, wireless research is rapidly progressing to embrace the millimeter-wave (mmW) and beyond frequency bands. These bands are inherently capable of satisfying these requirements and thereby support the emerging applications such as 5G new radio (5G NR), automotive radar, mmW imaging, high speed indoor communications, and beyond.

5G NR technology has shown significant potential in the mmW bands: 24.5 Gigahertz (GHz)-29.5 GHz and 37 GHz-43 GHz, due to the continuous demand for ultra-high-speed data rate communications (i.e., >10 gigabits per seconds (Gbps)). The free space path loss (FSPL) for mmW signals in those bands is usually high (i.e, >100 decibel (dB)), as a result phased-antenna arrays are employed to satisfy the link budget requirements. A radio frequency integrated circuit (RFIC) front-end architecture can be adopted based on full-band continuous coverage: 24.5 GHz-43 GHz, but frequency translation requires an instantaneous In-phase/Quadrature (IQ) image rejection technique.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Note that in the corresponding drawings of the embodiments, signals are represented with lines. Some lines may be thicker or have a slash over the lines, to indicate more constituent signal paths, such as a differential signal, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

Embodiments of the specification disclose frequency tripler circuits that cascades a frequency double with a double-balanced mixer to suppress environmental and power supply noise and reduce unwanted harmonic signals.

Dual-band continuous-time image rejection can be realized by opposite in-phase quadrature (IQ) local oscillator (LO) injection scenarios during signal up/down conversion. By fixing an Intermediate Frequency (IF) frequency at 7.5 GHz, low-side LO injection (e.g., freq_LO=freq_RF−freq_IF) for the 37-43 GHz band can be realized when LO frequency ranges between 29.5 and 35.5 GHz. High-side LO injection (e.g., freq_LO=freq_RF+freq_IF) for the 24.5-29.5 GHz band can be realized when LO frequency ranges between 32 and 37 GHz. Thus, LO needs to be in the range of 29.5 to 37 GHz to achieve the dual-band continuous-time image rejection circuits.

LO signal generation can be implemented by conventional phase-locked loops (PLL) at operating frequency ranges below 10 to 15 GHz to achieve low phase noise. For the PLL implementation to achieve the frequency range of 29.5 to 37 GHz, driving the voltage-controlled oscillator (VCO) of the PLL to a higher frequency would increase phase noise and power consumption of the PLL. Thus, direct LO signal generation for the frequency range of 29.5 to 37 GHz using a PLL circuit is not desirable.

Embodiments of the specification disclose a frequency doubler-tripler circuit that can be coupled to a PLL to generate a high frequency LO signal while achieving low phase noise. The frequency doubler-tripler circuit achieves higher frequency LO signal generation without increasing the power consumption of the PLL, and at the same time, achieves a low phase noise.

According to a first aspect, a frequency tripler circuit includes an amplifier to receive a balanced input signal at an input frequency and outputs a balanced signal at a second harmonic of the input frequency, and a passive double balanced mixer coupled to an output of the amplifier to receive the balanced signal at the second harmonic and the balanced input signal to generate an output balanced signal having a frequency triple the input frequency.

In one embodiment, the amplifier includes a first and a second transistors, where source terminals of the first and second transistors are coupled to a reference ground signal and drain terminals of the first transistor and the second transistor are coupled to a common node.

In one embodiment, the gate terminals of the first and the second transistors receive the balanced input signal in a class B mode excitation.

In one embodiment, the first and the second transistors are in symmetry so that the drain terminals of the first and second transistors that are coupled to the common node generates a signal having even harmonics of the input frequency.

In one embodiment, the amplifier further comprises a balun having a single ended port coupled to the common node and differential ports as output ports of the amplifier.

In one embodiment, the balun is frequency tuned to a second harmonic of the input frequency.

In one embodiment, the passive double balanced mixer includes a third and a fourth transistors having source terminals coupled to a first of the output ports of the amplifier; a fifth and a sixth transistors having source terminals coupled to a second of the output ports of the amplifier, wherein the gate terminals of the third and the sixth transistors are coupled to a first of the balanced input signal, wherein the gate terminals of the fourth and the fifth transistors are coupled to a second of the balanced input signal; and a transformer. The transformer includes a primary transformer winding having a first port coupled to drain terminals of the third and the fifth transistors, and a second port coupled to drain terminals of the fourth and the sixth transistors; and a second transformer winding having a third and a fourth ports as different output ports of the transformer, where a center tap of the primary transformer winding is coupled to a reference ground signal.

In one embodiment, a center tap of the secondary transformer winding is biased to the reference ground or to a voltage for a next stage of the frequency tripler circuit.

In one embodiment, the amplifier and the passive double balanced mixer are on-chip components.

In one embodiment, the input signals at the input frequency is generated by a phase locked loop circuit.

According to a second aspect, a local oscillator (LO) signal generation circuit includes a phase locked loop to receive a reference signal and to generate a balanced input signal at an input frequency. The LO signal generation circuit includes a frequency tripler circuit coupled to the phase locked loop to translate the balanced input signal at the input frequency to an output balanced signal having a frequency triple the input frequency. The frequency tripler circuit includes an amplifier to receive a balanced input signal at an input frequency and outputs a balanced signal at a second harmonic of the input frequency, and a passive double balanced mixer coupled to an output of the amplifier to receive the balanced signal at the second harmonic and the balanced input signal to generate an output balanced signal having a frequency triple the input frequency.

According to a third aspect, a frequency tripler circuit includes an amplifier to receive a balanced input signal at an input frequency and outputs a balanced signal at a second harmonic of the input frequency, and an active double balanced mixer coupled to an output of the amplifier to receive the balanced signal at the second harmonic and the balanced input signal to generate an output balanced signal having a frequency triple the input frequency.

In one embodiment, the active double balanced mixer includes a third and a fourth transistors having source terminals coupled to a first of the output ports of the amplifier; a fifth and a sixth transistors having source terminals coupled to a second of the output ports of the amplifier, wherein the gate terminals of the third and the sixth transistors are coupled to a first of the balanced input signal, wherein the gate terminals of the fourth and the fifth transistors are coupled to a second of the balanced input signal; and a transformer. The transformer includes a primary transformer winding having a first port coupled to drain terminals of the third and the fifth transistors, and a second port coupled to drain terminals of the fourth and the sixth transistors; and a second transformer winding having a third and a fourth ports as different output ports of the transformer, where a center tap of the primary transformer winding is coupled to a bias signal.

Figure 1:
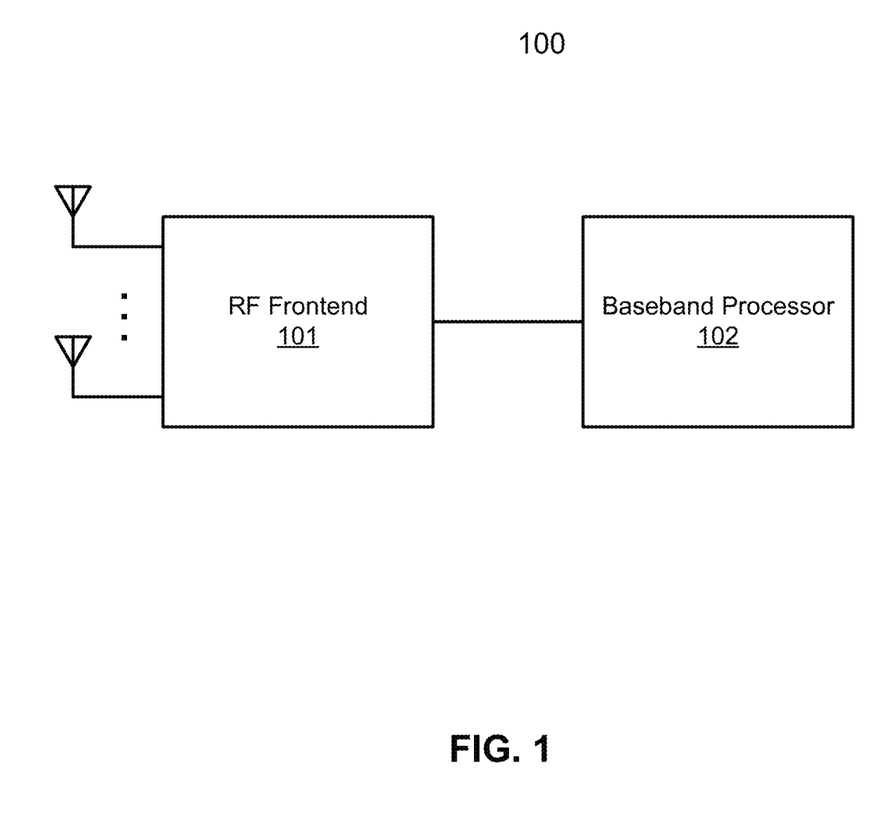
FIG. 1 is a block diagram illustrating an example of a wireless communication device according one embodiment.

FIG. 1 is a block diagram illustrating an example of a wireless communication device according one embodiment of the invention. Referring to FIG. 1, wireless communication device 100, also simply referred to as a wireless device, includes, amongst others, an RF frontend module 101 and a baseband processor 102. Wireless device 100 can be any kind of wireless communication devices such as, for example, mobile phones, laptops, tablets, network appliance devices (e.g., Internet of thing or IOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower frequency, e.g., IF. In microwave and satellite receivers it is often called the low-noise block (LNB) or low-noise downconverter (LND) and is often located at the antenna, so that the signal from the antenna can be transferred to the rest of the receiver at the more easily handled intermediate frequency. A baseband processor is a device (a chip or part of a chip) in a network interface that manages all the baseband processing functions to process baseband signals.

In a radio transmitter circuit, the RF frontend is a generic term for all the circuitry between the mixer stage up to and including the antenna. It consists of all the components in the transmitter that processes the signal at the more easily handled intermediate frequency, IF, before it is converted to a radio frequency, e.g., RF, for transmission. In microwave and satellite transmitters it is often called the block upconverter (BUC), which makes up the "transmit" side of the system, and is often used in conjunction with an LNB, which makes up the "receive" side of the system.

In one embodiment, RF frontend module 101 includes one or more RF transceivers, where each of the RF transceivers transmits and receives RF signals within a particular frequency band (e.g., a particular range of frequencies such as non-overlapped frequency ranges) via one of a number of RF antennas. The RF frontend IC chip further includes an IQ generator and/or a frequency synthesizer coupled to the RF transceivers. The IQ generator or generation circuit generates and provides an LO signal to each of the RF transceivers to enable the RF transceiver to mix, modulate, and/or demodulate RF signals within a corresponding frequency band. The RF transceiver(s) and the IQ generation circuit may be integrated within a single IC chip as a single RF frontend IC chip or package.

Figure 2:
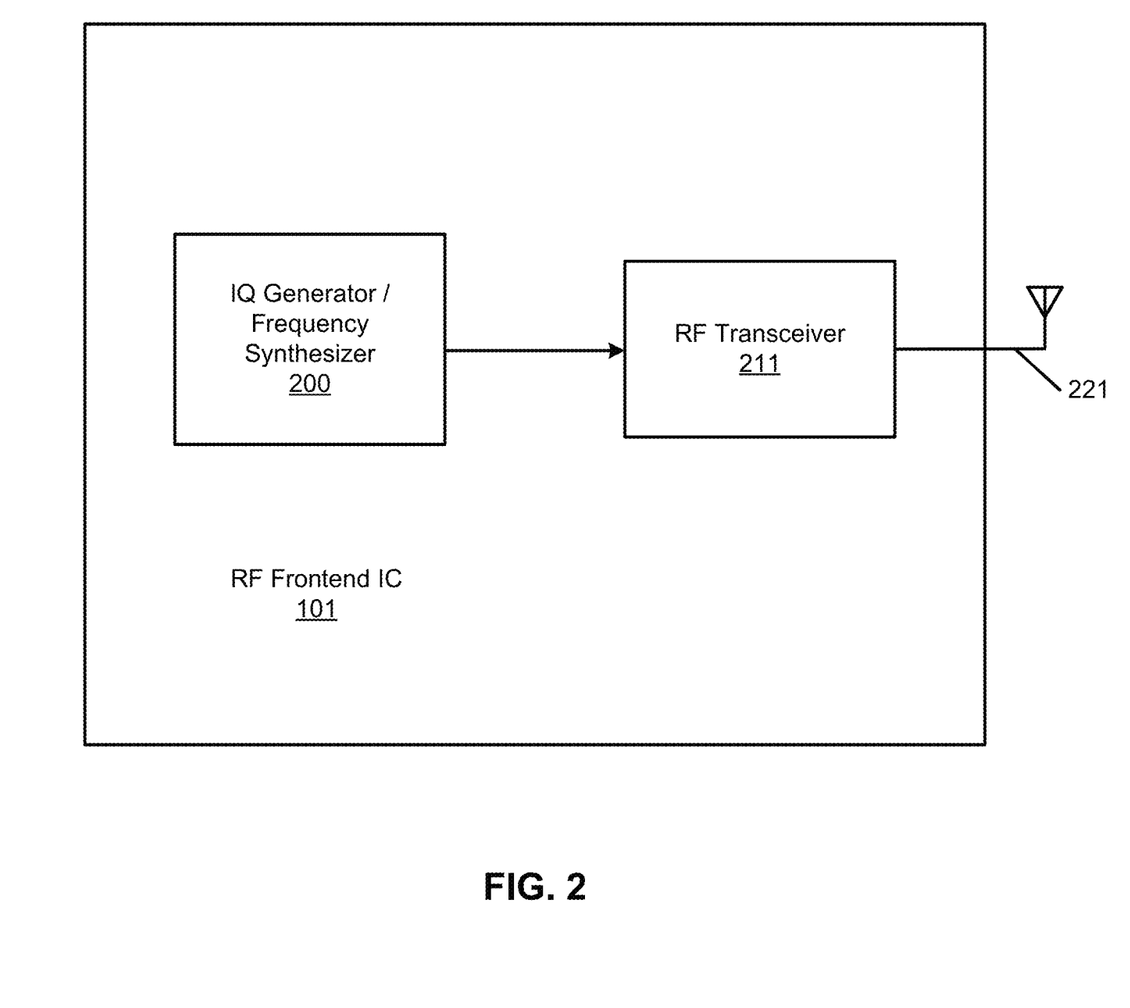
FIG. 2 is a block diagram illustrating an example of an RF frontend integrated circuit according to one embodiment.

FIG. 2 is a block diagram illustrating an example of an RF frontend integrated circuit according to one embodiment of the invention. Referring to FIG. 2, RF frontend 101 includes, amongst others, an IQ generator and/or frequency synthesizer 200 coupled to a RF transceiver 211. Transceiver 211 is configured to transmit and receive RF signals within one or more frequency bands or a broad range of RF frequencies via RF antenna 221. In one embodiment, transceiver 211 is configured to receive one or more LO signals from frequency synthesizer 200. The LO signals are generated for the one or more corresponding frequency bands. The LO signals are utilized to mix, modulate, demodulated by the transceiver for the purpose of transmitting and receiving RF signals within corresponding frequency bands. Although there is only one transceiver and antenna shown, multiple pairs of transceivers and antennas can be implemented, one for each frequency bands.

Figure 3:
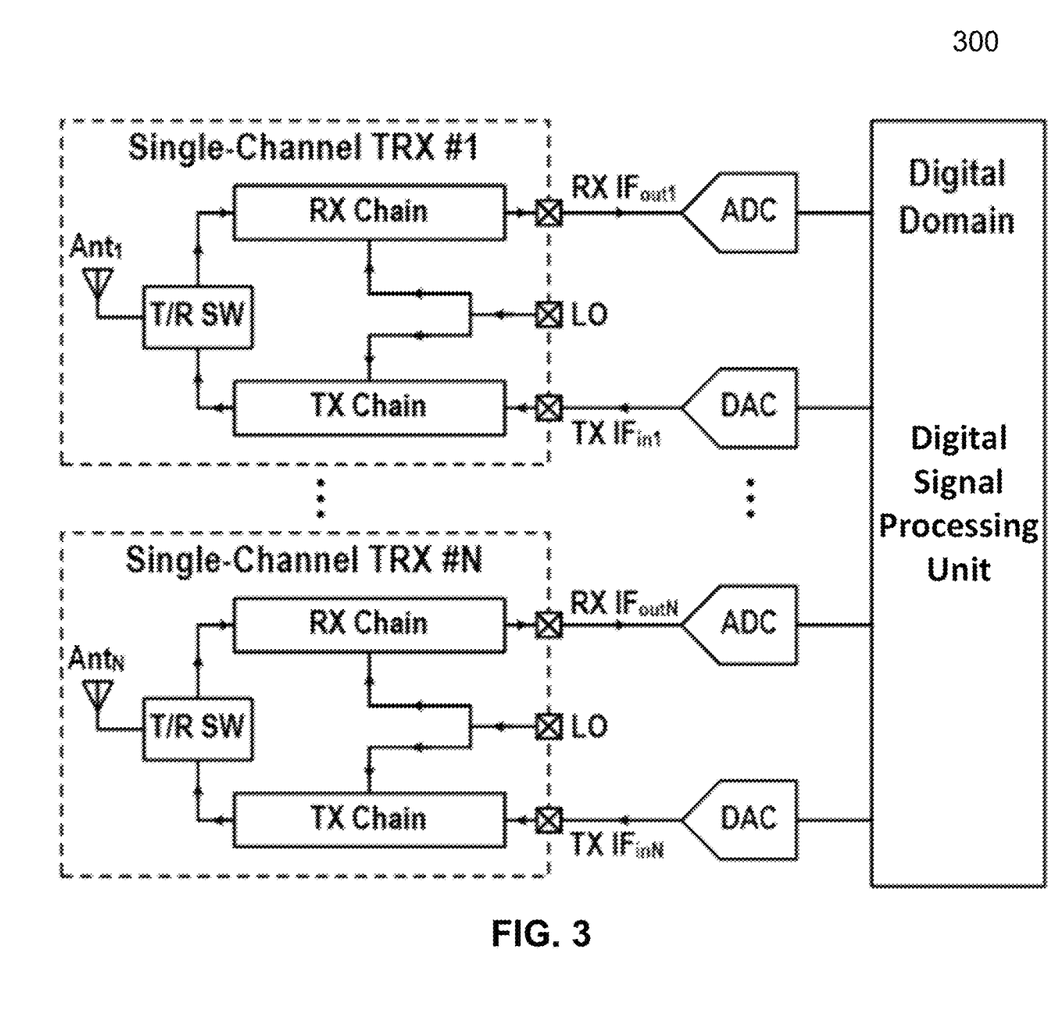
FIG. 3 is a block diagram illustrating an example of a transceiver according to one embodiment.

FIG. 3 is a block diagram illustrating an example of a transceiver according to one embodiment. Transceiver 300 may represent RF transceiver 211 of FIG. 2. Referring to FIG. 3, transceiver 300 includes a number of single-channel transceivers (e.g., single-channel TRX #1 . . . single-channel TRX #N), analog-digital converters (ADCs), digital-analog converters (DACs), and a digital signal processing unit. The digital signal processing unit can process digital signals in a digital domain. The single-channel transceivers each can include an up-conversion TX chain, a down-conversion RX chain, a T/R switch, and an antenna. The single-channel transceivers can each receive/transmit a respective analog stream simultaneously from/to one or more remote devices (e.g., a cellular mobile device, user equipment, and/or a cellular mobile device site) independent of the rest of the single-channel transceivers. Each of the ADCs can convert an analog signal to a digital signal. Each of the DACs can convert a digital signal to an analog signal. As shown, pairs of ADCs and DACs are coupled to each one of the single-channel transceivers to convert data streams from/to an analog domain to/from the digital domain. In one embodiment, the DSP unit is configured to generate a first set of digital data streams simultaneously and each of the first set of digital data streams is converted by a respective one of the DACs into an analog data stream to be transmitted to a remote device by a respective one of the single-channel transceiver.

In one embodiment, the single-channel transceivers, e.g., single-channel TRX #1 . . . single-channel TRX #N, have identical channels. In one embodiment, the RF frontend circuit is part of a cellular handheld user mobile device. In another embodiment, the RF frontend circuit is part of a cellular mobile device site which can stream data to one or more cellular handheld user mobile devices. In another embodiment, the identical channels can stream data to one or more cellular handheld user mobile devices by transmitting and receiving a respective independent data streams.

In one embodiment, the single-channel transceivers each can include an antenna which can include a directional antenna. The directional antenna of each of the single-channel transceivers can correspond to a different radiation angle or a similar radiation angle in comparison with the other directional antennas of the RF frontend. For example, different radiation angles can track a user moving within many corresponding radiation angles while similar radiation angles can track two or more users moving within a corresponding radiation angle or similar radiation angles.

In one embodiment, the DSP unit is further configured to receive a second set of digital data streams from the ADCs. In one embodiment, each of the second set of digital data streams is received by a respective one of the single-channel transceiver via a specific radiation angle. In one embodiment, the second set of digital data streams can be received simultaneously. In one embodiment, the second set of digital data streams are synchronized in time. In one embodiment, the first set of digital streams are synchronized in time.

Figure 4A:
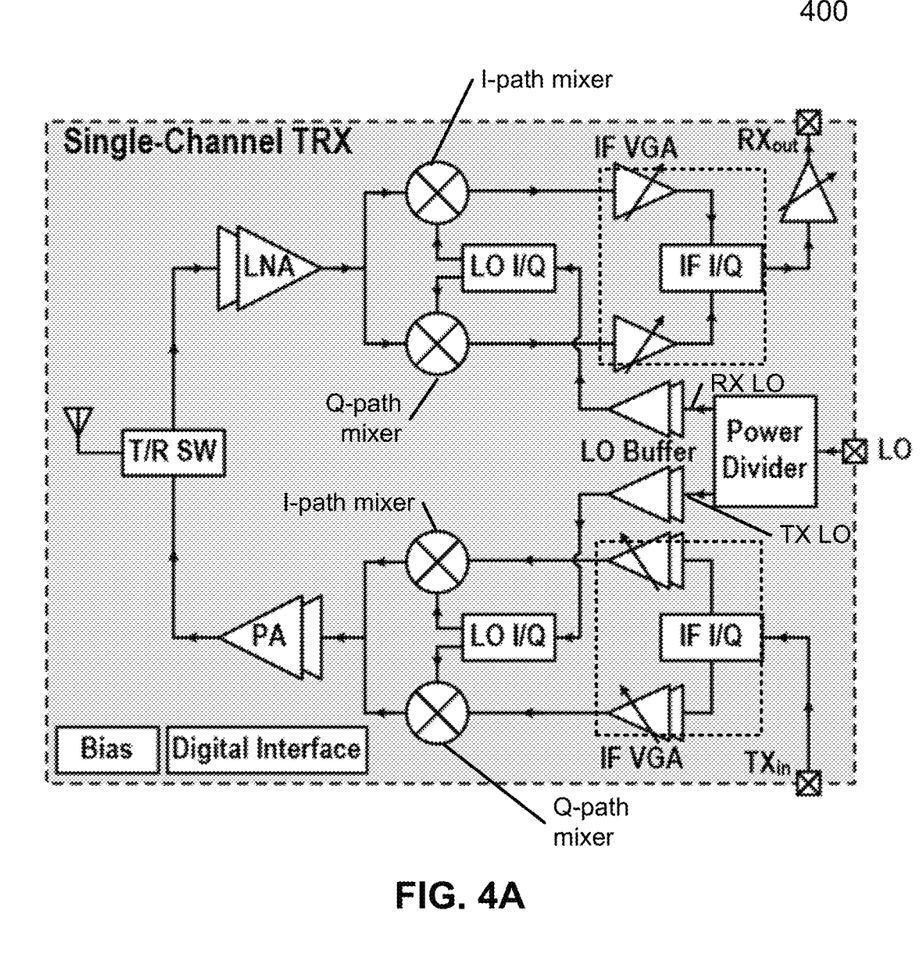
FIG. 4A is a block diagram illustrating an example of a single-channel transceiver circuit according to one embodiment.

FIG. 4A is a block diagram illustrating an example of a single-channel transceiver circuit according to one embodiment. Referring to FIG. 4A, single-channel transceiver 400 may represent single-channel TRX #1 of FIG. 3. Transceiver 400 is configured to transmit/receive RF signals for a single-channel. The single-channel can be a single frequency channel. In one embodiment, in the TX chain, transceiver 400 can include a power amplifier (PA), in-phase/quadrature (I/Q) up-conversion mixer(s), a local oscillator (LO) buffer, a LO I/Q generation network, IF variable-gain amplifiers (VGAs), and an IF I/Q generation network. The TX chain can include two paths, 1) I path for processing in-phase component signals and 2) Q-path for processing quadrature component signals. In one embodiment, IF I/Q quadrature network can generate a I component signal and a Q component signal based on an intermediate signal to be transmitted (e.g., TXin signal). The I and Q component signals can be further amplified by IF VGA. Up-conversion mixers for each of the I-path and the Q-path receives the amplified I and Q component signals and the LO I/Q signals (generated by the LO I/Q generation network based on an TX LO signal) and mixes/modulates the IF I/Q-path component signals to a higher frequency band. The higher frequency I and Q component signals are then recombined and amplified by the PA before being transmitted to the antenna via a T/R switch to be radiated by the antenna.

In one embodiment, for the RX chain, transceiver 400 can include a low-noise amplifier (LNA), I/Q down-conversion mixer(s), a LO buffer, an LO I/Q quadrature generation network, an IF I/Q quadrature generation network, and IF VGAs. The TX chain and RX chain can be coupled by a T/R switch, which is coupled to the antenna. Similar to the TX chain, the RX chain can include two paths, 1) I path for processing in-phase component signals and 2) Q-path for processing quadrature component signals. In one embodiment, the RX chain receives an RF signal, via the antenna, from a remote device and the RF signal is amplified by the LNA (which may or may not include a band pass filter). The I-path down-convert mixer and the Q-path down-convert mixer mixes/demodulates the RF signal into I-path signals and Q-path signals using the LO I/Q components (e.g., generated by LO I/Q generation network based on an RX LO signal). The I-path and Q-path signals can be further amplified by I-path and Q-path IF VGAs. The IF I/Q quadrature generation network can then generate an RXout signal based on the amplified I-path and Q-path signals. In one embodiment, the RXout signal may be further amplified by additional amplifiers or VGAs.

In one embodiment, the TX LO and RX LO signals are generated by an on-chip LO power divider using an LO signal. The LO signal may be provided by a crystal oscillator. In one embodiment, the TX LO and RX LO signals are buffered by LO buffers. In one embodiment, the single-channel TRX includes a bias interface which can provide bias voltage/current sources for the single-channel TRX. In another embodiment, a pair of ADC and DAC are integrated with the single-channel TRX and the single-channel TRX can include a digital interface to interface with the digital domain of a digital signal processing unit (such as the digital signal processing unit of FIG. 3).

Figure 4B:
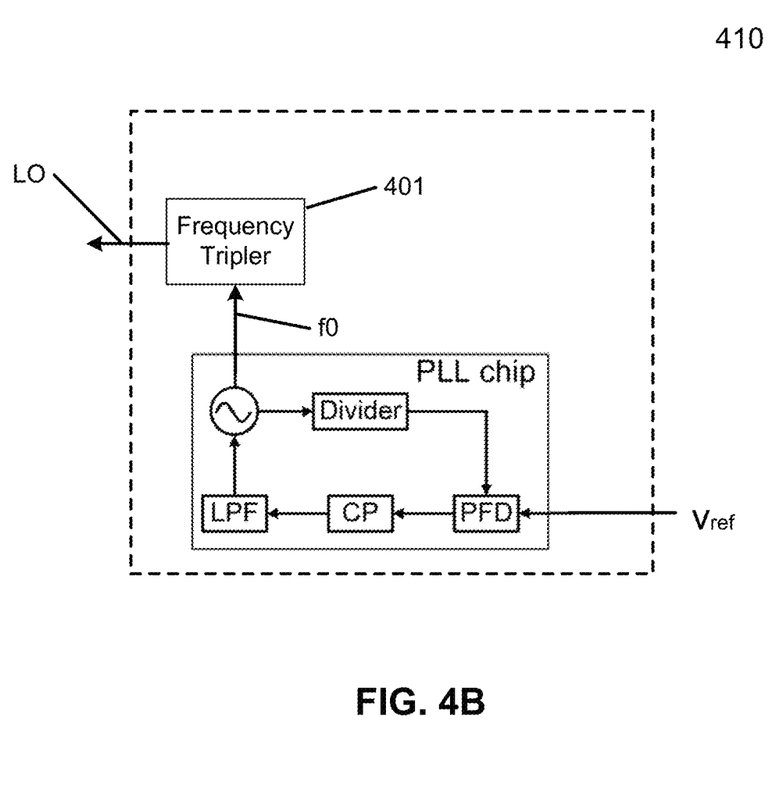
FIG. 4B is a block diagram illustrating an example of a LO signal generation circuit according to one embodiment.

In some embodiments, the LO signal is generated by a PLL chip coupled to a frequency doubler or frequency tripler circuit. FIG. 4B is a block diagram illustrating an example of a LO signal generation circuit 410 according to one embodiment. Circuit 410 can include a PPL chip coupled to a frequency tripler circuit 401. Circuit 410 can receive a reference signal V_ref at frequency ref and generate a LO signal at the frequency range 29.5-37 GHz, where V_ref can be provided by a crystal oscillator, or similar circuit.

The PLL chip can receive the reference signal V_ref and generates a signal $V_{f0}$ with frequency f0 approximately 10-15 GHz. The self-mixing frequency doubler or tripler circuit 401 can receive the $V_{f0}$ signal and generates the LO signal, where the LO signal has a frequency equal to 2 or 3 times f0. The $V_{f0}$ can be the LO signal used by any single-channel TRX #1-#N of FIG. 3 of the single-channel TRX 400 of FIG. 4A. A self-mixing frequency tripler circuit 401 is further described with respect to FIGS. 5-10.

The PLL chip can be a control circuits that generates an output signal whose phase is related to the phase of an input periodic signal (V_ref). Referring to FIG. 4B, in one embodiment, the PLL chip can include a voltage controlled oscillator (VCO), a low pass filter (LPF), a CP (current pump), and a feedback divider circuit with a phase-frequency detector (PFD) in a feedback loop. The VCO is a variable frequency oscillator that generates a periodic signal. The PFD compares the phase of the generated signal with the phase of the input periodic signal and provides a signal to the CP. The CP adjusts a charge (raises or lowers a voltage) to the VCO and causes the VCO to adjust its output signal to keep the phases of the generated signal and the input signal to match. The LPF is used to reduce high frequency components in the output of the PFD. LPF also removes high frequency noises.

Note that, matching the input and output signal phases in lock step also implies matching the frequency of the signals the same. In one embodiment, the feedback divider circuit is used to divide the VCO frequency to the PFD frequency, which allows the PLL to generate a signal with frequency that is multiples of the input frequency. In one embodiment, the generated signal is a balanced signal.

Figure 5:
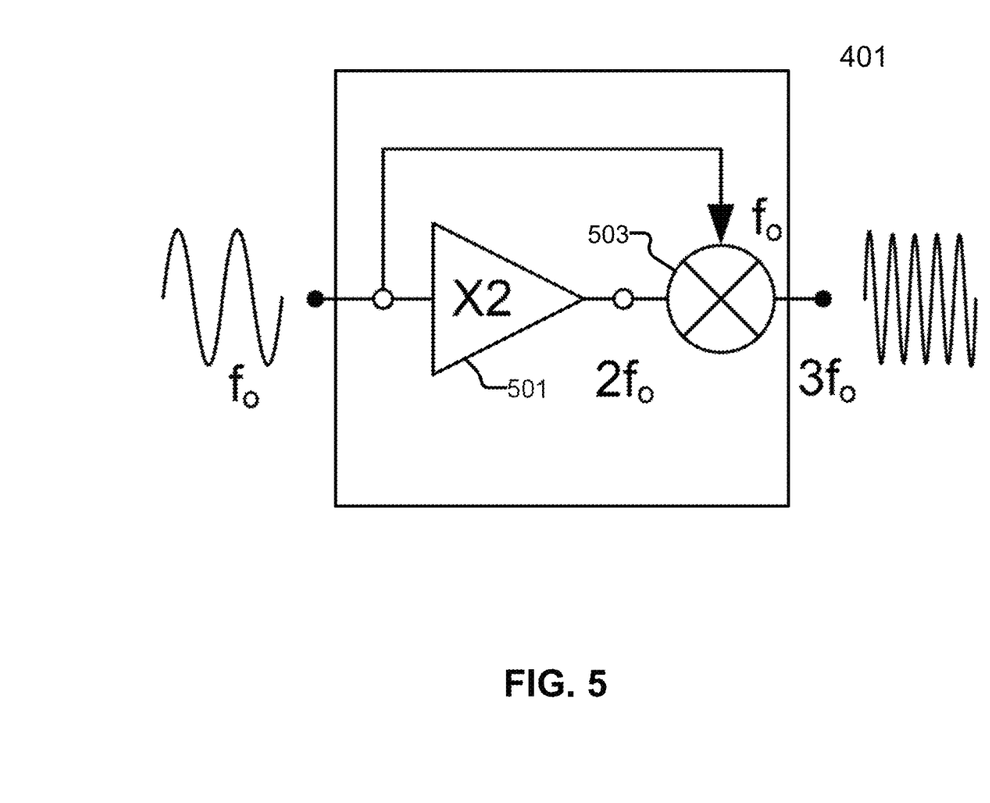
FIG. 5 is a block diagram illustrating an example of a frequency tripler architecture according one embodiment.

FIG. 5 is a block diagram illustrating an example of a frequency tripler architecture 500 according one embodiment. Frequency tripler 500 can represent frequency tripler circuit 401 of FIG. 4B. As shown, frequency tripler 500 includes a push-push frequency doubler 501 cascaded to an up-convert mixer 503. The frequency doubler 501 can translate a signal having an input frequency ($f_o$) to a signal having output frequency ($2f_o$). The mixer can translate a signal having a frequency ($2f_o$) to a signal having a frequency ($3f_o$) by injecting the translated signal with a signal of frequency ($f_o$) at the LO port of mixer 503. Injecting the translated signal with a signal of frequency ($f_o$) at the LO port is termed self-mixing.

Figure 6:
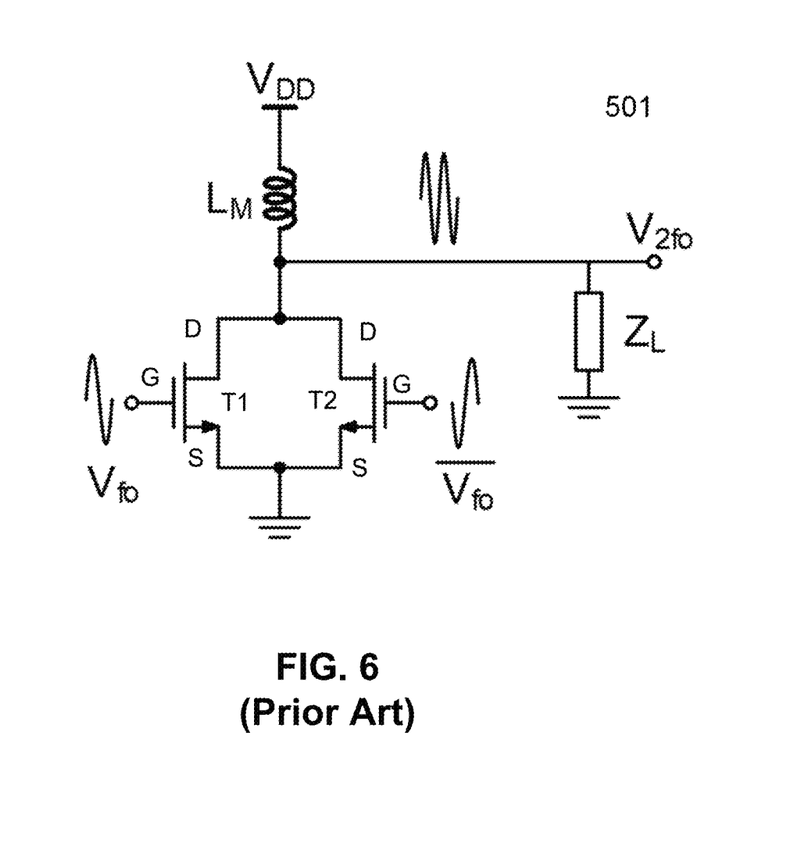
FIG. 6 is a block diagram illustrating an example of a frequency doubler circuit.

FIG. 6 is a block diagram illustrating an example of a frequency doubler circuit 501 based on a conventional push-push topology in complementary metal-oxide semiconductor (CMOS) technology. Circuit 501 can include n-type metal-oxide semiconductor (NMOS) transistors T1, T2 configured with common-source (S) and having drain (D) terminals that are shorted to one another. Transistors T1, T2 can be high-impedance driven by a balanced input signal ($V_{f0}$ and $V_{f0\_bar}$) in a class-B mode excitation. The balanced input signal can include component $V_{f0}$ at frequency f0 and component $V_{f0\_bar}$ that is 180 degrees out-of-phase from input signal $V_{f0}$. The gate (G) terminals of transistors T1, T2 for the class-B mode excitation are biased at the threshold voltage of the transistors (Vth) with a maximum input signal swing equal to the gate-breakdown root-mean-square (RMS) voltage. That is, the input signal ($V_{f0}$ and $V_{f0\_bar}$) requires a voltage swing greater than Vth but less than the gate breakdown RMS voltage of transistors T1, T2.

The second harmonic frequency generation of the frequency doubler 501 relies on the non-linear large-signal transconductance of transistors T1 and T2, which is determined by the harmonic content of the input signal. Shorting the drain (D) terminals allows the even-mode (i.e., in-phase) harmonics (including the second harmonic signal) to constructively combine at the drain terminals. The odd-mode (i.e., out-of-phase) harmonics destructively interefere and are rejected. This is based on the assumption that the transistor T1 and T2 in the doubler circuit 501 are symmetrical. In one embodiment, the output can be power-matched, at the second harmonic, to a 50-Ω load $Z_L$ or can drive a high-impedance load $Z_L$. The Inductor $L_m$ can be used to tune the frequency of the output or (D) terminals to resonate at the second harmonic frequency.

Figure 7:
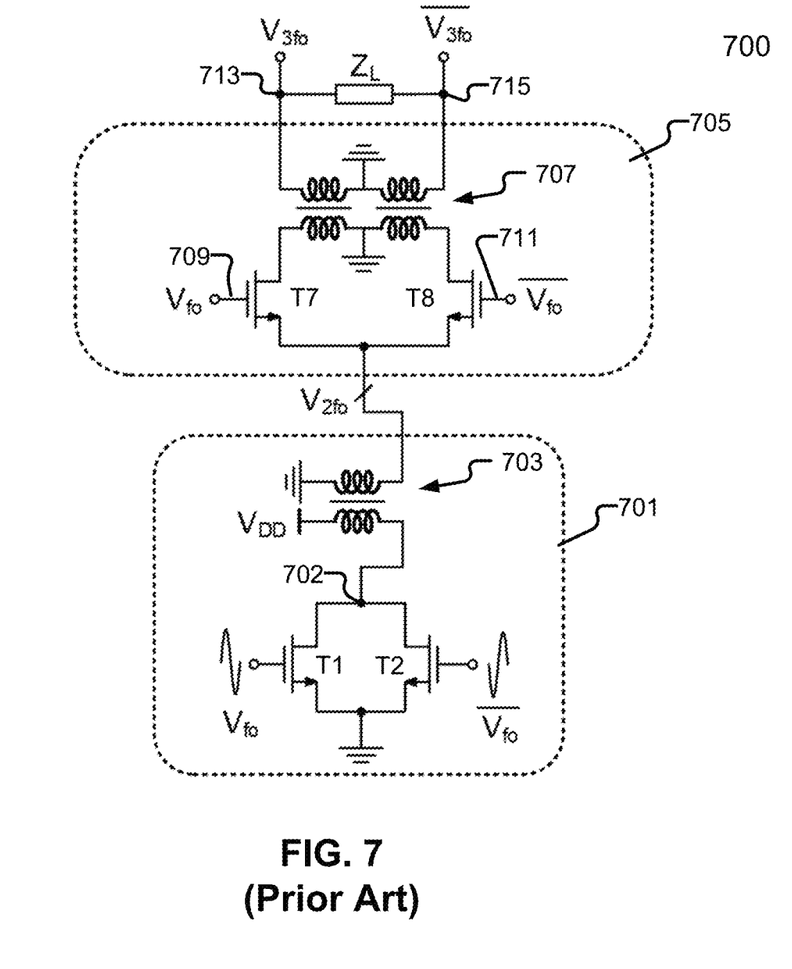
FIG. 7 is a block diagram illustrating an example of a frequency tripler circuit.

FIG. 7 is a block diagram illustrating an example of a frequency tripler circuit 700 that includes a push-push frequency doubler stage 701 cascaded to a single-balanced mixer stage 705. Frequency tripler circuit 700 can represent frequency tripler architecture 500 of FIG. 5, and frequency doubler stage 701 can represent frequency doubler 501 of FIG. 6. Frequency doubler stage 701 includes a frequency doubler that includes transistors T1 and T2 in common source configuration and having drain terminals shorted together to reject odd harmonics. Frequency doubler can output a single-ended second harmonic signal at node 702.

The frequency doubler stage 701 can include an interstage transformer 703 to isolate the direct current (DC) bias of the frequency doubler from mixer stage 705. Transformer 703 can preserve signal bias at node 702 for the frequency doubler when the input power is increased, which preserves the output signal swing of the frequency doubler. Further, the inductance of the primary winding of the transformer 703 can be selected to resonate with parasitic capacitance of transistors T1 and T2 (seen at node 702) at the second harmonic tone (e.g., 2f0) of the input signal $V_{f0}$.

The single-balanced mixer stage 705 can include transistors T7 and T8, having source terminals coupled to the secondary winding of transformer 703. The gates terminals of transistors T7 and T8 (or LO ports 709, 711 of the mixer) can receive components of a balanced input signal ($V_{f0}$ and $V_{f0\_bar}$).

The drain terminals of T7 and T8 are coupled to two ends of the primary winding of transformer 707, where the secondary winding of transformer 707 generates a balanced signal with components $V_{3f0}$ and $V_{3f0\_bar}$ at output ports 713-715. Here, transformer 707 can be used as a third harmonic filter, e.g., the primary/secondary winding inductances can be selected to resonate with parasitic capacitances of T7 and T8 at frequency 3f0. Further, transformer 707 can be used to perform impedance matching to an arbitrary load ($Z_L$).

Thus, circuit 700 achieves frequency tripling. The single-balanced mixer topology, however, cannot reject the LO feedthrough of the balanced input signal ($V_{f0}$ and $V_{f0\_bar}$) LO port of the mixer to the output ports 713-715.

Figure 8:
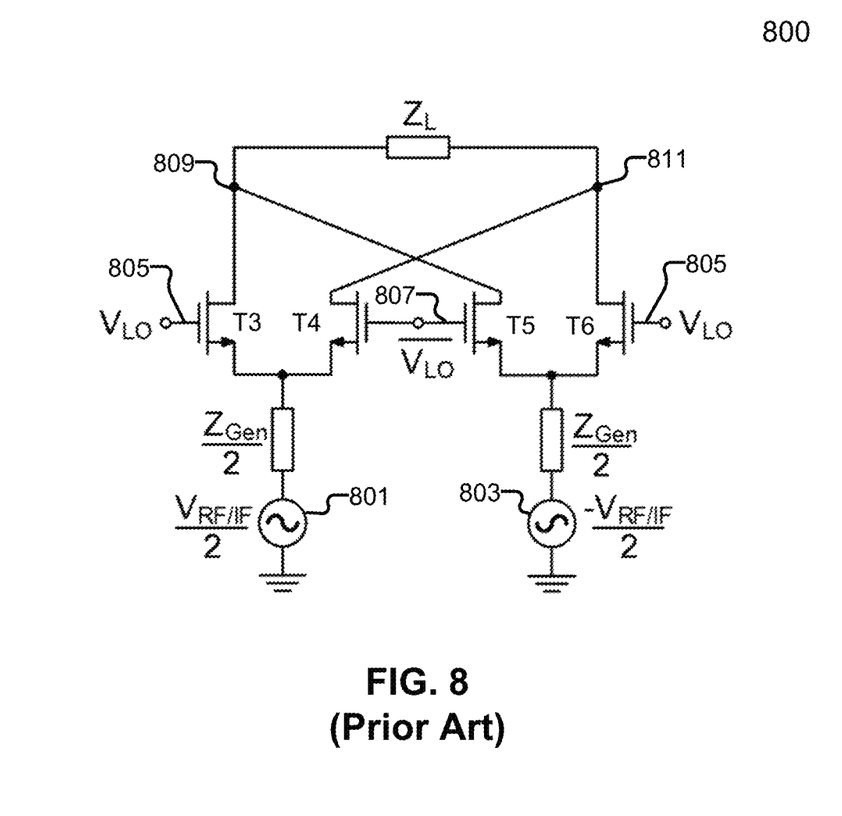
FIG. 8 is a block diagram illustrating an example of a double balanced passive mixer.

FIG. 8 is a block diagram illustrating an example of a double balanced passive mixer 800 based on a double-balanced topology that can reject LO feedthrough. Mixer 800 can include transistors T3, T4, T5, and T6. Transistors T3 and T4 can have source terminals coupled to an in-phase signal generator 801. Transistors T5 and T6 can have source terminals coupled to an out-of-phase signal generator 803. Note that signal generators 801-803 represents a balanced input source that provides a balanced input signal to mixer 800.

Mixer 800 can include LO ports 805-807 that receive a balanced LO signal with components ($V_{LO}$, $V_{LO\_bar}$). For example, LO port 805 at the gate terminals of transistors T3 and T6 can receive component $V_{LO}$ and LO port 807 at the gate terminals of transistors T4 and T5 can receive component $V_{LO\_bar}$. The drain terminal of T3 and T5 can be coupled to output port 809. The drain terminal of T4 and T6 can be coupled to output port 811. The output ports 809-811 can output a balanced signal, where a load impedance $Z_L$ is coupled between output ports 809-811.

Here, mixer 800 can be configured as an up-converter mixer (i.e., output voltage across $Z_L$ is filtered around ($f_{RF}=f_{IF}\pm f_{LO}$)) when the input source is excited at $f_{IF}$. Alternatively, mixer 800 can be configured as a down-converter mixer (i.e., output voltage across $Z_L$ is filtered around ($f_{IF}=f_{RF}\pm f_{LO}$)) when the input source is excited at $f_{RF}$.

Unlike the single-balanced topology, the double-balanced topology of mixer 800 can cancel the LO port signal feedthrough that is generated by the NMOS Cds (drain-to-source) parasitic capacitances and that appears at the output ports, without cancelling the up-converted/down-converted signals. Note that mixer 800 is designed to be substantially symmetrical for the LO port signal feedthrough to cancel out.

Figure 9:
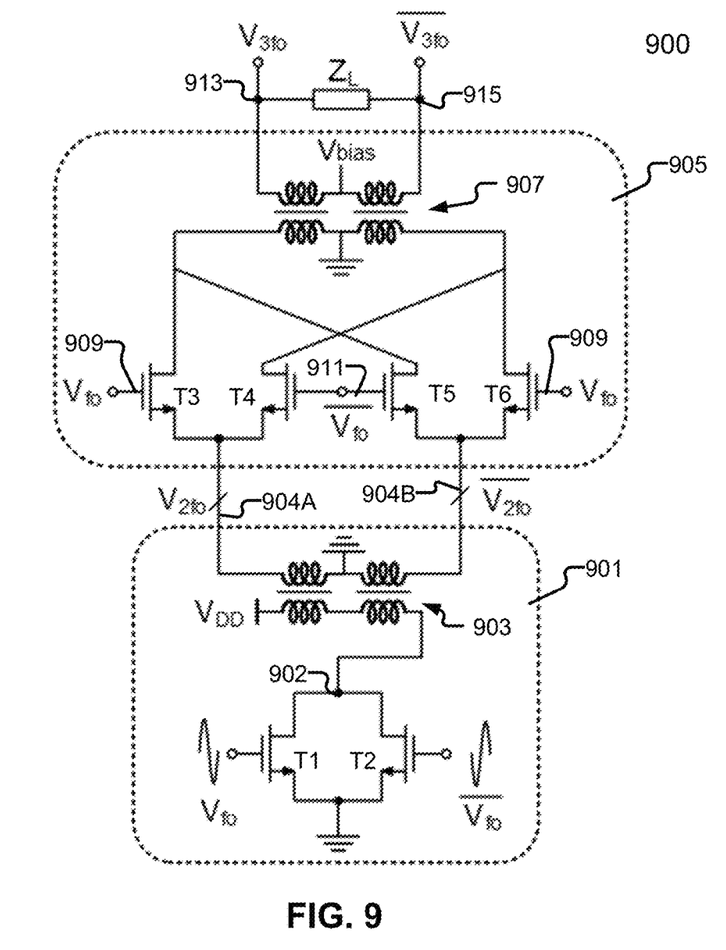
FIG. 9 is a block diagram illustrating a frequency tripler circuit with a passive double-balanced mixer stage according to one embodiment.

FIG. 9 is a block diagram illustrating a frequency tripler circuit 900 with a passive double-balanced mixer stage according to one embodiment. Frequency tripler circuit 900 can represent frequency tripler architecture 500 of FIG. 5. Frequency tripler circuit 900 can include a push-push frequency doubler stage 901 cascaded to a passive double-balanced mixer stage 905. Frequency doubler stage 901 can represent frequency doubler 501 of FIG. 6. Frequency doubler stage 801 can include a frequency doubler that includes transistors T1 and T2 in common source configuration and having drain terminals shorted together to reject odd harmonics. Frequency doubler can output a single-ended second harmonic signal at node 902, the drain terminals of transistors T1 and T2.

The frequency doubler stage 901 can include an interstage balun 903 to convert the single-ended second harmonic signal at node 902 to a differential signal at nodes 904A and 904B, where the differential signal has components ($V_{2f0}$, $V_{2f0\_bar}$). Balun 903 can include a primary winding having one end coupled to bias voltage Vdd, and another end coupled to node 902; and a second winding having one end output component $V_{2f0}$ and another end output component $V_{2f0\_bar}$. A center tap for the secondary winding can be coupled to reference ground.

In one embodiment, balun 903 can isolate the direct current (DC) bias of the frequency doubler stage 901 from mixer stage 905. Balun 903 can preserve the signal bias at node 902 for the frequency doubler when the input power is increased, which preserves the output signal swing of the frequency doubler. Further, the inductance of the primary winding of balun 903 can be selected to resonate with parasitic capacitance of the transistors of the frequency doubler stage 901 (which is seen at output node 902 of the frequency doubler) at the second harmonic tone (e.g., 2f0) of the input signal $V_{f0}$.

In one embodiment, passive double-balanced mixer stage 905 can translates an input signal at frequency (2f0) to a signal having frequency (3f0) by injecting $V_{f0}$ at the LO ports (909, 911) at mixer stage 905. The passive double-balanced mixer stage 905 can include transistors T3, T4, T5, T6, and transformer 907. Transistors T3 and T4 can have source terminals coupled to node 904A. Transistors T5 and T6 can have source terminals coupled to node 904B. Note that nodes 904A and 904B represent a balanced input signal received by the passive double-balanced mixer. The frequency doubler (or amplifier) and the passive double balanced mixer can be on-chip components.

The passive double-balanced mixer stage 905 can include LO ports 909, 911 that receive a self-mixing balanced signal having components ($V_{f0}$, $V_{f0\_bar}$). For example, LO port 909 at the gate terminals of transistors T3 and T6 can receive component $V_{f0}$ and LO port 911 at the gate terminals of transistors T4 and T5 can receive component $V_{f0\_bar}$. The drain terminal of T3 and T5 can be coupled to a first end of a primary winding of transformer 907. The drain terminal of T4 and T6 can be coupled to a second end of the primary winding of transformer 907. A center tap of the primary winding of transformer 907 can be coupled to reference ground.

In one embodiment, a first end of the secondary winding of transformer 907 represents output port 913. A second end of the secondary winding of transformer 907 represents output port 915. A center tap of the secondary winding of transformer 907 can be coupled to reference ground or to a bias voltage Vbias to bias a circuit at the next stage of circuit 900 (i.e., modeled by impedance load $Z_L$). The output ports 913-915 can output a balanced signal to drive a load impedance $Z_L$ that is coupled between output ports 913-915. Here, the mixer stage 905 is configured as an up-converter mixer and an output voltage across $Z_L$ can be filtered at the third harmonic tone frequency=3f0 for the input signal $V_{f0}$.

As described, unlike the single-balanced topology shown in FIG. 7, the double-balanced topology in the mixer stage 905 can cancel the mixer LO port signal feedthrough that is generated by the NMOS Cds (drain-to-source) parasitic capacitances and that appears at the drain terminals of the transistors T3, T4, T5, and T6, without cancelling the up-converted signals. The cancellation of the LO feedthrough lowers a phase noise of circuit 900. Note that mixer stage 905 is configured to be substantially symmetrical for the LO port signal feedthrough to cancel out.

Thus, circuit 900 achieves frequency tripling for an input signal and can reject the LO feedthrough at the mixer LO port of the mixer stage 905 to achieve low phase noise.

Figure 10:
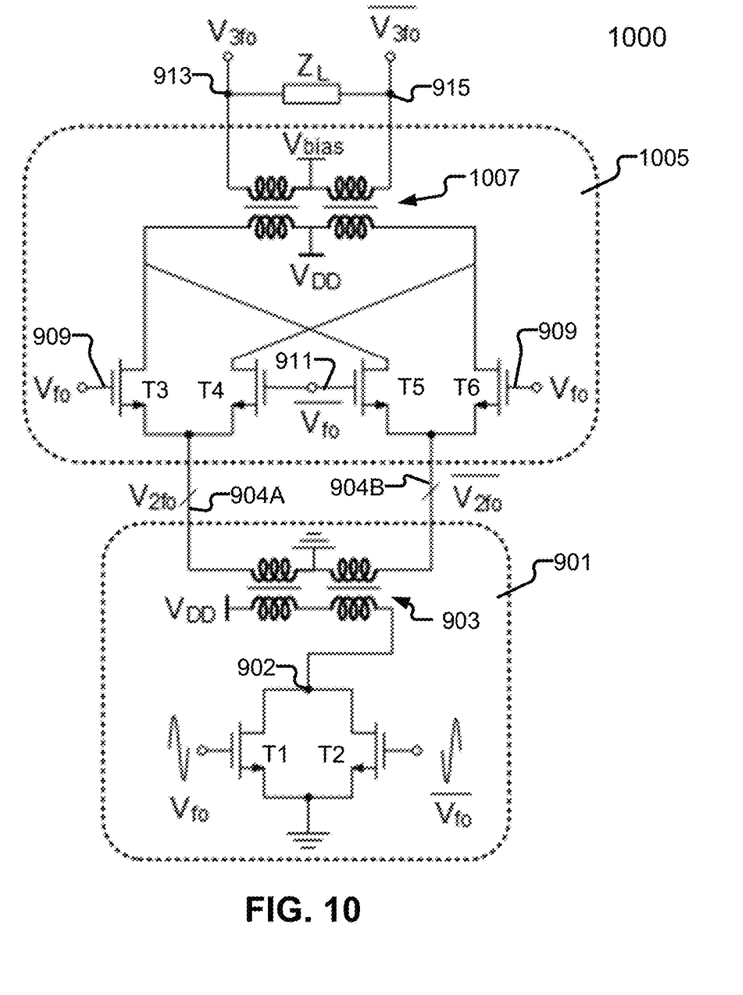
FIG. 10 is a block diagram illustrating a frequency tripler circuit with an active double-balanced mixer stage according to one embodiment.

FIG. 10 is a block diagram illustrating a frequency tripler circuit 1000 with an active double-balanced mixer stage 1005 according to one embodiment. Frequency tripler circuit 1000 can represent frequency tripler circuit 900 of FIG. 9, but with an active double-balanced mixer stage 1005 that is biased to Vdd so the transistors T3, T4, T5, and T6 can provide an active signal gain. The frequency doubler (or amplifier) and the active double balanced mixer can be on-chip components.

For example, active double-balanced mixer stage 1005 can translates an input signal at frequency (2f0) to a signal at frequency (3f0) by injecting $V_{f0}$ at the LO ports (909, 911) of the mixer at mixer stage 1005. Furthermore, active double-balanced mixer stage 1005 can further provide a signal amplification.

For example, active double-balanced mixer stage 1005 can include transistors T3, T4, T5, T6, and transformer 1007. Transistors T3 and T4 can have source terminals coupled to node 904A. Transistors T5 and T6 can have source terminals coupled to node 904B. Nodes 904A and 904B can receive a balanced input signal with components ($V_{2f0}$, $V_{2f0\_bar}$).

The active double-balanced mixer stage 1005 can include LO ports 909, 911 that receive the self-mixing balanced signal having components ($V_{f0}$, $V_{f0\_bar}$). For example, LO port 909 at the gate terminals of transistors T3 and T6 can receive component $V_{f0}$ and LO port 911 at the gate terminals of transistors T4 and T5 can receive component $V_{f0}$ bar.

The drain terminal of transistors T3 and T5 can be coupled to a first end of a primary winding of transformer 907. The drain terminal of transistors T4 and T6 can be coupled to a second end of the primary winding of transformer 907. A center tap of the primary winding of transformer 907 can be coupled to a bias signal Vdd.

In one embodiment, a first end of the secondary winding of transformer 907 represents output port 913. A second end of the secondary winding of transformer 907 represents output port 915. A center tap of the secondary winding of transformer 907 can be coupled to reference ground or to a bias voltage Vbias to bias a circuit at the next stage of circuit 1000 (i.e., modeled by impedance load $Z_L$). Here, transistors T3, T4, T5, and T6 can be configured to function as mutating switches operating in non-linearity regions and the output voltage across $Z_L$ can be filtered at the third harmonic tone frequency=3f0 with signal amplification from the active mixer configuration.

Similarly, unlike the single-balanced topology of FIG. 7, the double-balanced topology in the active mixer stage 1005 can cancel the mixer LO port signal feedthrough that is generated by the NMOS Cds (drain-to-source) parasitic capacitances and that appears at the drain terminals of the transistors T3, T4, T5, and T6, without cancelling the up-converted signals. The cancellation of the LO feedthrough lowers a phase noise of circuit 1000. Note that mixer stage 1005 is configured to be substantially symmetrical for the LO port signal feedthrough to cancel out.

Thus, circuit 1000 achieves frequency tripling for an input signal with active signal amplification and can reject the LO feedthrough at the mixer LO port of the mixer stage 1005 to achieve low phase noise.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A frequency tripler circuit, comprising:
an amplifier to receive a balanced input signal at an input frequency and outputs a balanced signal at a second harmonic of the input frequency; and
a double balanced mixer coupled to an output of the amplifier to receive the balanced signal at the second harmonic and the balanced input signal to generate an output balanced signal having a frequency triple the input frequency, wherein the double balanced mixer comprises:
a third and a fourth transistors having source terminals coupled to a first of output ports of the amplifier;
a fifth and a sixth transistors having source terminals coupled to a second of the output ports of the amplifier, wherein gate terminals of the third and the sixth transistors are coupled to a first of the balanced input signal, wherein gate terminals of the fourth and the fifth transistors are coupled to a second of the balanced input signal; and
a transformer coupled to the third, fourth, fifth, and sixth transistors, wherein the transformer of the double balanced mixer comprises:
a primary transformer winding having a first port coupled to drain terminals of the third and the fifth transistors, and a second port coupled to drain terminals of the fourth and the sixth transistors; and
a secondary transformer winding having a third and a fourth ports as different output ports of the transformer, wherein a center tap of the primary transformer winding is coupled to a reference ground signal.

2. The frequency tripler circuit of claim 1, wherein the amplifier comprises a first and a second transistors, wherein source terminals of the first and second transistors are coupled to the reference ground signal and drain terminals of the first transistor and the second transistor are coupled to a common node.

3. The frequency tripler circuit of claim 2, wherein gate terminals of the first and the second transistors receive the balanced input signal in a class B mode excitation.

4. The frequency tripler circuit of claim 2, wherein the first and the second transistors are in symmetry so that the drain terminals of the first and second transistors that are coupled to the common node generates a signal having even harmonics of the input frequency.

5. The frequency tripler circuit of claim 2, wherein the amplifier further comprises a balun having a single ended port coupled to the common node and differential ports as the output ports of the amplifier.

6. The frequency tripler circuit of claim 5, wherein the balun is frequency tuned to the second harmonic of the input frequency.

7. The frequency tripler circuit of claim 1, wherein a center tap of the secondary transformer winding is biased to the reference ground signal or to a voltage for a next stage of the frequency tripler circuit.

8. The frequency tripler circuit of claim 1, wherein the amplifier and the double balanced mixer are on-chip components.

9. The frequency tripler circuit of claim 1, wherein the balanced input signal at the input frequency is generated by a phase locked loop circuit.

10. A local oscillator (LO) signal generation circuit, comprising:

a phase locked loop to receive a reference signal and to generate a balanced input signal at an input frequency; and a frequency tripler circuit coupled to the phase locked loop to translate the balanced input signal at the input frequency to an output balanced signal having a frequency triple the input frequency, the frequency tripler circuit comprising:

an amplifier to receive the balanced input signal at the input frequency and outputs a balanced signal at a second harmonic of the input frequency; and a double balanced mixer coupled to an output of the amplifier to receive the balanced signal at the second harmonic and the balanced input signal to generate an output balanced signal having a frequency triple the input frequency, wherein the double balanced mixer comprises:

a third and a fourth transistors having source terminals coupled to a first of output ports of the amplifier;

a fifth and a sixth transistors having source terminals coupled to a second of the output ports of the amplifier, wherein gate terminals of the third and the sixth transistors are coupled to a first of the balanced input signal, wherein gate terminals of the fourth and the fifth transistors are coupled to a second of the balanced input signal; and a transformer coupled to the third, fourth, fifth, and sixth transistors, wherein the transformer of the double balanced mixer comprises:

a primary transformer winding having a first port coupled to drain terminals of the third and the fifth transistors, and a second port coupled to drain terminals of the fourth and the sixth transistors; and a secondary transformer winding having a third and a fourth ports as different output ports of the transformer, wherein a center tap of the primary transformer winding is coupled to a reference ground signal.

11. The LO signal generation circuit of claim 10, wherein the amplifier comprises a first and a second transistors, wherein source terminals of the first and second transistors are coupled to the reference ground signal and drain terminals of the first transistor and the second transistor are coupled to a common node.

12. The LO signal generation circuit of claim 11, wherein gate terminals of the first and the second transistors receive the balanced input signal in a class B mode excitation.

13. The LO signal generation circuit of claim 11, wherein the first and the second transistors are in symmetry so that the drain terminals of the first and second transistors that are coupled to the common node generates a signal having even harmonics of the input frequency.

14. The LO signal generation circuit of claim 11, wherein the amplifier further comprises a balun having a single ended port coupled to the common node and differential ports as the output ports of the amplifier.

15. The LO signal generation circuit of claim 14, wherein the balun is frequency tuned to the second harmonic of the input frequency.

16. The frequency tripler circuit of claim 10, wherein a center tap of the secondary transformer winding is biased to the reference ground signal or to a voltage for a next stage of the frequency tripler circuit.

17. A frequency tripler circuit, comprising:

an amplifier to receive a balanced input signal at an input frequency and outputs a balanced signal at a second harmonic of the input frequency, wherein the amplifier comprises a first and a second transistors, wherein source terminals of the first and second transistors are coupled to a reference ground signal and drain terminals of the first transistor and the second transistor are coupled to a common node, and the amplifier comprises a balun having a single ended port coupled to the common node and differential ports as output ports of the amplifier; and a double balanced mixer coupled to an output of the amplifier to receive the balanced signal at the second harmonic and the balanced input signal to generate an output balanced signal having a frequency triple the input frequency, wherein the double balanced mixer comprises:

a third and a fourth transistors having source terminals coupled to a first of the output ports of the amplifier;

a fifth and a sixth transistors having source terminals coupled to a second of the output ports of the amplifier, wherein gate terminals of the third and the sixth transistors are coupled to a first of the balanced input signal, wherein gate terminals of the fourth and the fifth transistors are coupled to a second of the balanced input signal; and a transformer coupled to the third, fourth, fifth, and sixth transistors.

18. The frequency tripler circuit of claim 17, wherein gate terminals of the first and the second transistors receive the balanced input signal in a class B mode excitation.

19. The frequency tripler circuit of claim 17, wherein the first and the second transistors are in symmetry so that the drain terminals of the first and second transistors that are coupled to the common node generates a signal having even harmonics of the input frequency.

20. The frequency tripler circuit of claim 17, wherein the balun is frequency tuned to the second harmonic of the input frequency.

* * * * *